(12) United States Patent
Chu et al.

(10) Patent No.: US 9,201,817 B2
(45) Date of Patent: Dec. 1, 2015

(54) METHOD FOR ALLOCATING ADDRESSES TO DATA BUFFERS IN DISTRIBUTED BUFFER CHIPSET

(75) Inventors: Huaixiang Chu, Shanghai (CN); Qingjiang Ma, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 180 days.

(21) Appl. No.: 13/512,507

(22) PCT Filed: Oct. 18, 2011

(86) PCT No.: PCT/CN2011/080890
§ 371 (c)(1),
(2), (4) Date: May 29, 2012

(87) PCT Pub. No.: WO2013/016893
PCT Pub. Date: Feb. 7, 2013

(65) Prior Publication Data
US 2013/0036287 A1 Feb. 7, 2013

(30) Foreign Application Priority Data
Aug. 3, 2011 (CN) .......................... 2011 1 0221491

(51) Int. Cl.
G06F 3/00 (2006.01)
G06F 13/16 (2006.01)
G11C 8/06 (2006.01)
G11C 7/10 (2006.01)
G11C 11/4093 (2006.01)

(52) U.S. Cl.
CPC ...... *G06F 13/16* (2013.01); *G11C 7/10* (2013.01); *G11C 8/06* (2013.01); *G11C 11/4093* (2013.01)

(58) Field of Classification Search
CPC .......... G11C 7/10; G11C 11/4093; G11C 8/06
USPC ............................................................ 710/9
See application file for complete search history.

(56) References Cited

U.S. PATENT DOCUMENTS 6,530,006 B1    3/2003  Dodd et al.
8,335,115 B2 *  12/2012  Lee ........................... 365/189.05
2006/0262611 A1 * 11/2006  Lee et al. .................. 365/189.12

FOREIGN PATENT DOCUMENTS

CN        1341910 A     3/2002
CN      101610197 A    12/2009

OTHER PUBLICATIONS

Written Opinion of the International Searching Authority issued in International Patent Application No. PCT/CN2011/080890 dated May 3, 2012.

*Primary Examiner* — Chun-Kuan Lee
(74) *Attorney, Agent, or Firm* — Oliff PLC

(57) ABSTRACT

The present invention relates to a method for allocating addresses to data buffers in a distributed buffer chipset, in which a memory controller informs a central buffer of the beginning of address allocation through a Command/Address channel (CA), and then the central buffer informs through a data control channel all the data buffers of preparing for receiving address parameters through respective data channels, and in this way, each data buffer receives and latches the respective address parameter from the memory controller through the respective data, thus avoiding the defect in the prior art that the size of the data buffer and the size of the entire distributed buffer chipset is bigger as several address pins need to be additionally configured in each data buffer to allocate the respective address parameter.

18 Claims, 5 Drawing Sheets

METHOD FOR ALLOCATING ADDRESSES TO DATA BUFFERS IN DISTRIBUTED BUFFER CHIPSET

BACKGROUND OF THE PRESENT INVENTION

1. Field of Invention

The present invention relates to technologies of allocating addresses to data buffers, and specifically to a method for allocating addresses to data buffers applied in a distributed buffer chipset.

2. Description of Related Arts

The current computer system has increasingly high requirements on the memory (generally Synchronous Dynamic Random Access Memory (SDRAM)) capacity. However, as a larger memory capacity could result in a higher load and reduced signal integrity, the maximum memory capacity is reaching a limit. In order to increase system memory capacity, a Load Reduced Dual In-line Memory Module (LRDIMM) is designed, within which a buffer is inserted between a memory controller and a memory (for example, an SDRAM) to buffer all the information including commands, addresses and data. The memory controller drives several buffers, each of which drives several memories. In this way, a higher memory capacity could be obtained.

At present, the buffer of the LRDIMM may not be a single chip, and some may be distributed buffer chipsets formed by multiple chips. The distributed buffer chipset includes several data buffers for buffering data and a central buffer for buffering the commands and address, and also controlling the data buffers. In order to enable correctly identifying and controlling the corresponding data buffer by the central buffer, each data buffer needs a separate address. An existing method for allocating address parameters for the data buffer is that, each data buffer is additionally configured with several special address pins to allocate the address. N pins can allocate $2^N$ addresses, and the number of the pins N is determined by the number M of the data buffers included within the distributed buffer chipset, that is, the value of N is the minimum integer value satisfying an inequality of $2^N \geq M$, for example, when M=9, N=4.

Such configuration of the address pin undoubtedly increases the entire size of the chip and also affects the size of the entire distributed buffer chipset. However, in order to enhance the market competitive ability, a thinner and smaller computer is an ultimate goal at present, and in this way, the distributed buffer chipset configured in the computer inevitably develops towards such a goal, which causes limited pin resources of the data buffers encapsulated in the distributed buffer chipset. In such a case, it is necessary to develop a method for allocating addresses to data buffers in a distributed buffer chipset, so as to solve the additional configuration problem of the address pin, so that the design of the distributed buffer chipset conforms to the development trend of this industry.

SUMMARY OF THE PRESENT INVENTION

In view of the disadvantages in the prior art, an object of the present invention is to provide a method for allocating addresses to data buffers in a distributed buffer chipset, so as to avoid additional configuration of the address pin, thereby facilitating reduction of the size of the data buffer and the size of the entire distributed buffer chipset.

In order to accomplish the above objects, the method for allocating addresses to data buffers in a distributed buffer chipset provided by the present invention is applied in a distributed buffer chipset controlled by a memory controller, wherein the distributed buffer chipset at least comprises a central buffer connected to the memory controller through a Command/Address channel (CA) and a plurality of data buffers respectively connected to the memory controller through respective data channels, and the data buffers are connected to the central buffer through sharing a common data control channel, the method for allocating addresses to data buffers in a distributed buffer chipset comprising steps of: 1) at the memory controller, sending an address allocation start signal to the central buffer through the CA, and sending respective address parameters to the corresponding data buffers through the data channels; 2) at the central buffer, sending the received address allocation start signal to all the data buffers through the data control channel, so as to inform all the data buffers of preparing for receiving the address parameters through the respective data channels; and 3) at each data buffer, each data buffer correspondingly receiving the address parameter through the respective data channel and latching the address parameter. The address parameter is formed by a specific number of address configuration values, the address configuration value is a binary number, and the number of the address parameter is defined by a calculation formula as follows: the value of N is a minimum integer value satisfying an inequality $2^N \geq M$, where N is the specific number of the address configuration value, and M is the number of the data buffers in the distributed buffer chipset.

In an embodiment of the method for allocating addresses to data buffers in a distributed buffer chipset consistent with the present invention, the step 1) further comprises: 1-1) at the memory controller, presetting a designated time and a specific number; and 1-2) at the memory controller, sending an address allocation start signal to the central buffer through the CA, resetting the time and starting timing at the same time, sending respective address configuration values to the corresponding data buffers through the data channels, and enabling the data channels to maintain a state of driving the corresponding address configuration values before the time reaches the preset designated time. The step 3) further comprises: 3-1) at each data buffer, correspondingly receiving the address configuration value through the respective data channel and latching the address configuration value by the data buffer; 3-2) at the memory controller, when the time reaches the preset designated time, stopping sending the address configuration values, subtracting 1 from the preset specific number, and judging whether the specific number after the subtraction of 1 is 0, if yes, performing step 3-3); otherwise, returning to the step 1-2); and 3-3) at each data buffer, according to a precedence order of the latched address configuration values, sequentially arranging the address configuration values to obtain a respective address parameter with the first latched address configuration value as the lowest bit and with the last latched address configuration value as the highest bit, and ending the allocation process.

The designated time is set to ensure that the data buffer has enough time to receive and latch the address configuration value thereof after receiving the address allocation start signal.

In this embodiment, the data channel has multiple signal lines respectively connected to a corresponding number of data pins of the corresponding data buffer.

Preferably, the step 1-1) further comprises: sending the address configuration value through any one of all the signal lines of the data channel. The step 3-1) further comprises: at each data buffer, once a certain data pin of the data buffer receives the address configuration value, latching the address configuration value.

Alternatively, the step 1-1) may further comprise: designating a certain data pin of the data buffer to receive the address configuration value, and sending the same address configuration value through all the signal lines of the data channel, so as to ensure that the data pin designated in the data buffer receives the address configuration value.

In another embodiment of the method for allocating addresses to data buffers in a distributed buffer chipset consistent with the present invention, the step 1) further comprises: 1-a) at the memory controller, presetting a specific number; and 1-b) at the memory controller, sending an address allocation start signal to the central buffer through the CA, sending respective address configuration values to the corresponding data buffers through the data channels, and enabling the data channels to maintain a state of driving the corresponding address configuration values. The step 3) further comprises: 3-a) at each data buffer, correspondingly receiving the address configuration value through the respective data channel, latching the address configuration value, and sending a completion notification signal to the memory controller by the data buffer; 3-b) at the memory controller, after receiving the completion notification signals sent from all the data buffers, stopping sending the address configuration values, subtracting 1 from the preset specific number, and judging whether the specific number after the subtraction of 1 is 0, if yes, performing step 3-c); otherwise, returning to the step 1-b); and 3-c) at each data buffer, according to a precedence order of the latched address configuration values, sequentially arranging the address configuration values to obtain a respective address parameter with the first latched address configuration value as the lowest bit and with the last latched address configuration value as the highest bit, and ending the allocation process. The data channel has multiple signal lines respectively connected to a corresponding number of data pins of the corresponding data buffer. Preferably, the step 1-a) further comprises: driving the address configuration value through any one of all the signal lines of the data channel. The step 3-a) further comprises: at each data buffer, once a certain data pin of the data buffer receives the address configuration value, latching the address configuration value. Alternatively, the step 1-a) may further comprise: designating a certain data pin of the data buffer to receive the address configuration value, and driving the same address configuration value through all the signal lines of the data channel, so as to ensure that the data pin designated in the data buffer receives the address configuration value.

In still another embodiment of the method for allocating addresses to data buffers in a distributed buffer chipset consistent with the present invention, the data channel has multiple signal lines respectively connected to a corresponding number of data pins of the corresponding data buffer, and the step 1) further comprises: at the memory controller, sending all the address configuration values of the address parameter to the data buffer at the same time according to a certain order through the specific number of signal lines in each data channel in a manner of one signal line corresponding to one address configuration value. The step 3) further comprises: at each data buffer, correspondingly receiving the address configuration values through its data pins, sequentially latching the received address configuration values according to the order, and finally obtaining the respective address parameter by the data buffer.

The beneficial effects of the present invention are described in the following with reference to the above technical solutions. Compared with the prior art, the present invention adopts the following solutions: the memory controller is used in advance to inform the central buffer of the beginning of the address allocation through the CA, and then the central buffer informs through the shared data control channel all the data buffers of preparing for receiving the address parameters through the respective data channels, and in this way, each data buffer receives the respective address parameter from the memory controller through the respective data channel and latches the address parameter, thus avoiding the defect in the prior art that the size of the data buffer and the size of the entire distributed buffer chipset is bigger as several address pins need to be additionally configured in each data buffer to allocate the respective address parameter.

LIST OF REFERENCE NUMERALS

1 Memory controller
2 Distributed buffer chipset
20 Central buffer
22 Data buffer
CA Command/Address channel
DQ[0:7], DQ[8:15], DQ[16:23],
DQ[24:31], DQ[32:39], DQ[40:47],
DQ[48:55], DQ[56:63], DQ[64:71] Data channel
DQCTL Data control channel
S10-S30, S100-S106,
S100'-S106', S10'-S30' Step

DETAILED DESCRIPTION OF THE PREFERRED EMBODIMENTS

The embodiments of the present invention are described in the following through specific examples, and those with ordinary skill in the art can easily understand other advantages and effects of the present invention according to the content disclosed in the specification. The present invention may also be implemented or applied through other different specific examples, and various modifications and variations may be made to the details in the specification on the basis of different opinions and applications without departing from the principle of the present invention.

Figure 1:
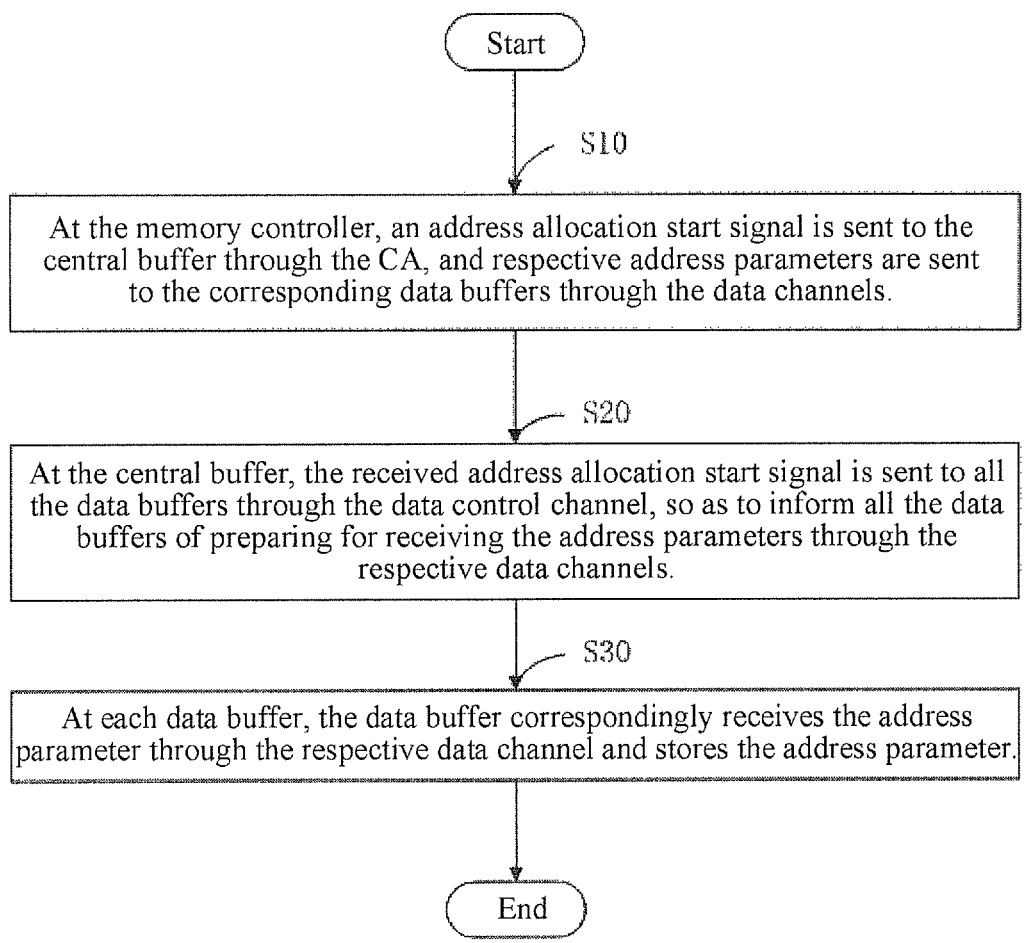
FIG. 1 is a schematic operational flow chart of a method for allocating addresses to data buffers in a distributed buffer chipset consistent with the present invention.

FIG. 1 is a schematic operational flow chart of a method for allocating addresses to data buffers in a distributed buffer chipset consistent with the present invention. The specific operational steps of the method for allocating addresses to data buffers in a distributed buffer chipset in the present invention are described in detail in the following with reference to FIG. 2.

Figure 2:
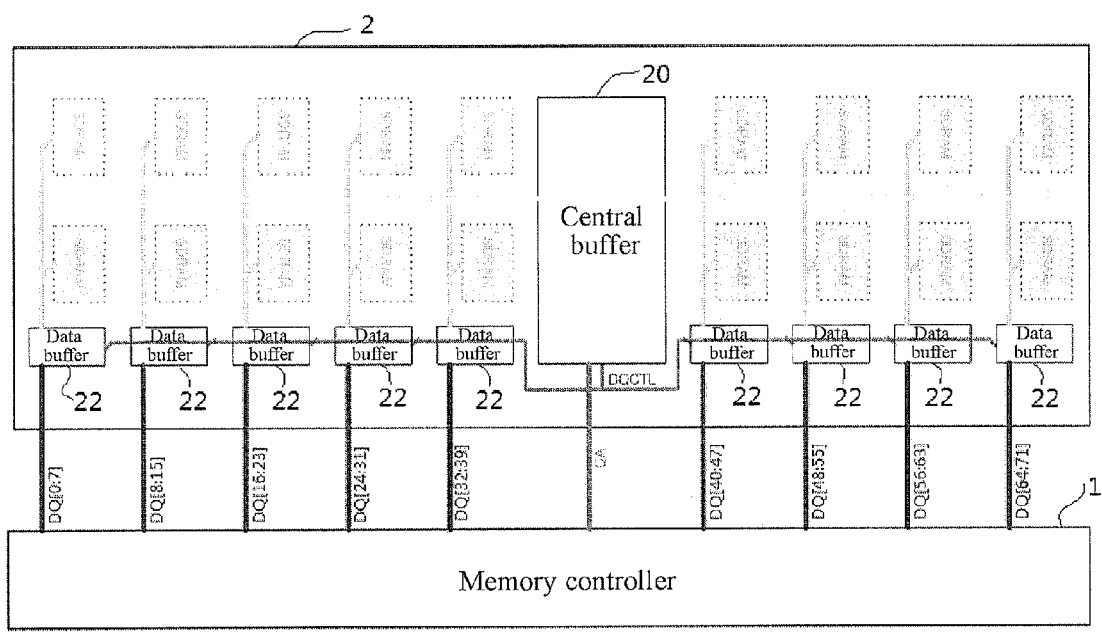
FIG. 2 is a schematic structural view of an embodiment of a distributed buffer chipset controlled by a memory controller.

As shown in FIG. 2, the method for allocating addresses to data buffers in a distributed buffer chipset in the present invention is applied in a distributed buffer chipset 2 controlled by a memory controller 1. The distributed buffer chipset 2 (not including an SDRAM) at least includes a central buffer 20 connected to the memory controller 1 through one CA, and a plurality of data buffer 22 respectively connected to the memory controller 1 through respective separate data channels (DQ[0:7], DQ[8:15], DQ[16:23], DQ[24:31], DQ[32:39], DQ[40:47], DQ[48:55], DQ[56:63] and DQ[64:71]), and the data buffer 22 is connected to the central buffer 20 through sharing one data control channel (DQCTL).

Step S10 is first performed, in which at the memory controller 1, an address allocation start signal is sent to the central buffer 20 through the CA, and respective address parameters are sent to the corresponding data buffers 22 through the data channels. The address parameter is formed by a specific number of address configuration values, the address configuration value is a binary number, and a calculation formula of the specific number is as follows: the value of N is a minimum integer value satisfying an inequality $2^N \geq M$, where N is the specific number, and M is the number of the data buffers in the distributed buffer chipset. Then, Step S20 is performed.

In Step S20, at the central buffer 20, the received address allocation start signal is sent to all the data buffers 22 through the data control channel (DQCTL), so as to inform all the data buffers 22 of preparing for receiving the address parameters through the respective data channels. Afterwards, Step S30 is performed.

In Step S30, at each data buffer 22, the data buffer 22 correspondingly receives the address parameter through the respective data channel and latches the address parameter.

The operational steps of the method for allocating addresses to data buffers in a distributed buffer chipset in the present invention are described in further detail in the following through specific embodiments.

The First Embodiment

Figure 3:
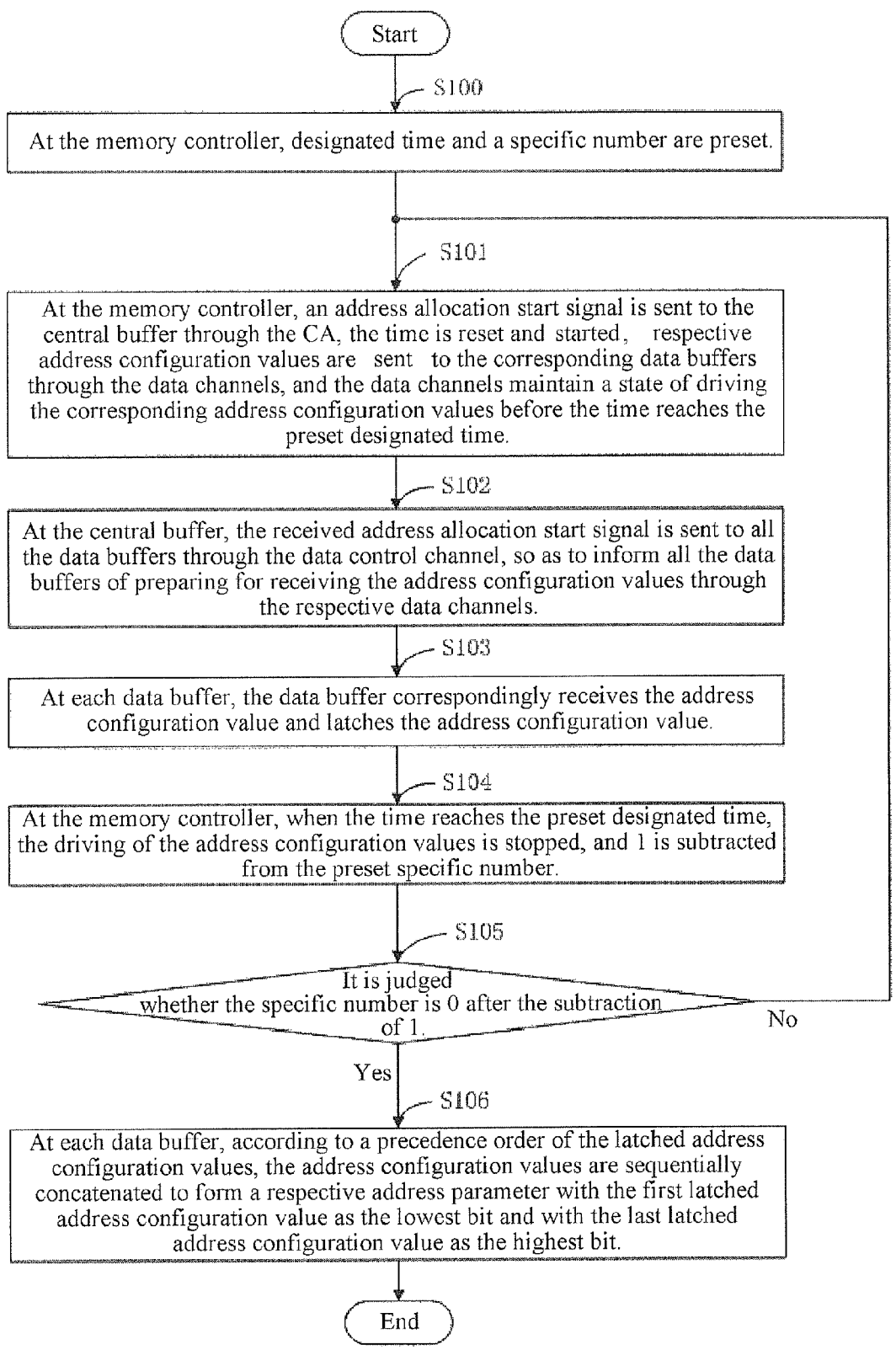
FIG. 3 is a schematic operational flow chart of a method for allocating addresses to data buffers in a distributed buffer chipset according to the first embodiment of the present invention.

Preferable, as shown in FIG. 3, is a schematic operational flow chart of a method for allocating addresses to data buffers in a distributed buffer chipset according to the first embodiment of the present invention. The specific operational steps of the method for allocating addresses to data buffers in a distributed buffer chipset in the present invention are described in detail in the following with reference to FIG. 2.

Step S100 is first performed, in which at the memory controller 1, designated time and a specific number are preset. The designated time is set to ensure that the data buffer 22 has enough time to receive and latch the address configuration value after receiving the address allocation start signal. Then, Step S101 is performed.

In Step S101, at the memory controller 1, an address allocation start signal is sent to the central buffer 20 through the CA, the time is reset and started, respective address configuration values are sent to the corresponding data buffers 22 through the data channels (DQ[0:7], DQ[8:15], DQ[16:23], DQ[24:31], DQ[32:39], DQ[40:47], DQ[48:55], DQ[56:63] and DQ[64:71]), and the data channels maintain a state of driving the corresponding address configuration values before the time reaches the preset designated time. Afterwards, Step S102 is performed.

In Step S102, at the central buffer 20, the received address allocation start signal is sent to all the data buffers 22 through the data control channel (DQCTL), so as to inform all the data buffers 22 of preparing for receiving the address configuration values through the respective data channels. Then, Step S103 is performed.

In Step S103, at each data buffer 22, the data buffer 22 correspondingly receives the address configuration value and latches the address configuration value. Then, Step S104 is performed.

In Step S104, at the memory controller 1, when the time reaches the preset designated time, the driving of the address configuration values is stopped, and 1 is subtracted from the preset specific number. Then, Step S105 is performed.

In Step S105, it is judged whether the specific number is 0 after the subtraction of 1. If yes, Step S106 is performed; otherwise, Step S101 is returned.

In Step S106, at each data buffer, according to a precedence order of the latched address configuration values, the address configuration values are sequentially concatenated to form a respective address parameter with the first latched address configuration value as the lowest bit and with the last latched address configuration value as the highest bit.

In this embodiment, the data channel has multiple signal lines respectively connected to a corresponding number of data pins of the corresponding data buffer. In this embodiment, the data channel has, by way of example, 8 signal lines (but the present invention is not limited thereto, and the data channel may have 4 or 11 signal lines in other embodiments). Accordingly, in the step S101, at the memory controller 1, the address configuration value is sent through any one of the 8 signal lines of each data channel. Therefore, in the step S103, at each data buffer 22, once a certain data pin of the data buffer 22 receives the address configuration value, the address configuration value is latched, that is, in this embodiment, it is not defined which signal line of the 8 signal lines is responsible for sending the address configuration value, as long as one of the 8 signal lines participates in sending the address configuration value.

However, the sending manner of the data line is not limited to the description in the above embodiment, and in other embodiments, a certain data pin (for example, DQ0) of the data buffer 22 may be designated to receive the address configuration value. In this way, in consideration of different types of distributed buffer chipsets and computer motherboards, actual connection relationships may be different, and it is not necessary that the 8 signal lines (DQ[0]-DQ[7]) are connected to the 8 data pins (DQ0-DQ7) one by one according to the sequence numbers, that is, the signal line DQ[0] is connected to the data pin DQ0, the signal line DQ[1] is connected to the data pin DQ1, and so on. Therefore, in order to ensure that the designated data pin DQ0 can receive the address configuration value, in the step S101, the 8 signal lines of the data channel all send the same address configuration value. In this way, even if the data pin DQ0 is connected to any one of the signal lines DQ[1] to DQ[7] instead of the signal line DQ[0], the data pin DQ0 can still receive the desired address configuration value.

In order to understand more clearly how the address allocation for multiple data buffers is achieved without requiring the configuration of additional address pins through the method for allocating addresses to data buffers in a distributed buffer chipset in this embodiment, description is given in the following through an example in which 9 data buffers exist, the data channel is formed by 8 signal lines, and the first data pins DQ0, DQ8, DQ16, DQ24, DQ32, DQ40, DQ48, DQ56 and DQ64 (as shown in FIG. 2) in the data channels of data buffers are used as receiving ports of the address configuration values. The 9 data buffers need 4-bit binary addresses ($2^4>9$), and the address parameter is recorded as CHIPID[3:0] at this time, so the specific number is preset to 4 at the memory controller. First, at the memory controller, an address allocation start signal is sent to the central buffer through the CA informing the configuration of CHIPID[0], the time is reset and started, the same binary address configuration value CHIPID[0] is sent to the corresponding data buffers through all 8 signal lines of the data channels to ensure that the first data pin of the data buffer can receive the value, and the memory buffer maintain a state of driving the corresponding address configuration value CHIPID[0] before the time reaches the preset designated time. Then, at the central buffer, the received address allocation start signal is sent to all the data buffers through the data control channel (DQCTL), so as to inform all the data buffers of preparing for receiving the address configuration value CHIPID[0] through the respective data channels, and the data buffers correspondingly receive the address configuration value CHIPID[0] through the respective first data pins and latches the address configuration value. Afterwards, at the memory controller, when the time reaches the preset designated time, the driving of the address configuration value CHIPID[0] is stopped, and 1 is subtracted from the preset specific number, and then, it is judged whether the specific number is 0 after the subtraction of 1, and if not, the above steps are repeated to sequentially configure the address configuration values CHIPID[1], CHIPID[2] and CHIPID[3] till the specific number is 0. In this way, each data buffer obtains 4 binary address configuration values from CHIPID[0] to CHIPID[3], and according to the precedence order of the latched address configuration values, the address configuration values are sequentially concatenated to form the respective address parameter with the first latched address configuration value CHIPID[0] as the lowest bit and with the last latched address configuration value CHIPID[3] as the highest bit, that is, the arrangement is as follows: CHIPID[3], CHIPID[2], CHIPID[1] and CHIPID[0]. For example, through performing the above steps, if the address configuration values latched by the $8^{th}$ data buffer are successively CHIPID[0]=0, CHIPID[1]=0, CHIPID[2]=0 and CHIPID[3]=1, the corresponding address parameter is a binary number 1000. Thus, through the present invention, the address allocation for all the data buffers in the entire distributed buffer chipset is successfully achieved while avoiding the configuration of address pins.

It should be noted that, the above embodiment is described through the example in which 9 data buffers exist and the data channel is formed by 8 signal lines, but the present invention is not limited thereto, and in the following embodiments, description may also be given through an example in which 18 data buffers exist, the data channel is formed by 4 signal lines, and the second data pin in the data channel of each data buffer is designated as a receiving port of the address configuration value. The 18 data buffers need 5-bit binary addresses ($2^5$>18), and the address parameter is recorded as CHIPID[4:0] at this time, so the specific number is preset to 5 at the memory controller. First, at the memory controller, an address allocation start signal is sent to the central buffer through the CA and the configuration of CHIPID[0] is informed, the time is reset and started, the same binary address configuration value CHIPID[0] is sent to the corresponding data buffers through the 4 signal lines of the data channels to ensure that the second data pin of the data buffer can receive the value, and the data channels are enabled to maintain the state of sending the corresponding address configuration value CHIPID[0] before the time reaches the preset designated time. Then, at the central buffer, the received address allocation start signal is sent to all the data buffers through the data control channel (DQCTL), so as to inform all the data buffers of preparing for receiving the address configuration value CHIPID[0] through the respective data channels, and the data buffers correspondingly receive the address configuration value CHIPID[0] through the respective second data pins and latches the address configuration value. Afterwards, at the memory controller, when the time reaches the preset designated time, the driving of the address configuration value CHIPID[0] is stopped, and 1 is subtracted from the preset specific number, and then, it is judged whether the specific number is 0 after the subtraction of 1, and if not, the above steps are repeated to sequentially configure the address configuration values CHIPID[1], CHIPID[2], CHIPID[3] and CHIPID[4] till the specific number after the subtraction of 1 is 0. In this way, each data buffer obtains 5 binary address configuration values from CHIPID[0] to CHIPID[4], and according to the precedence order of the latched address configuration values, the address configuration values are sequentially concatenated to form the respective address parameter with the first latched address configuration value CHIPID[0] as the lowest bit and with the last latched address configuration value CHIPID[4] as the highest bit, that is, the arrangement is as follows: CHIPID[4], CHIPID[3], CHIPID [2], CHIPID[1] and CHIPID[0]. For example, through performing the above steps, if the address configuration values latched by the $18^{th}$ data buffer are successively CHIPID[0]=0, CHIPID[1]=1, CHIPID[2]=0, CHIPID[3]=0 and CHIPID[4]=1, the corresponding address parameter is a binary number 10010. Thus, through the present invention, the address allocation for all the data buffers in the entire distributed buffer chipset is successfully achieved while avoiding the configuration of address pins.

The Second Embodiment

Figure 4:
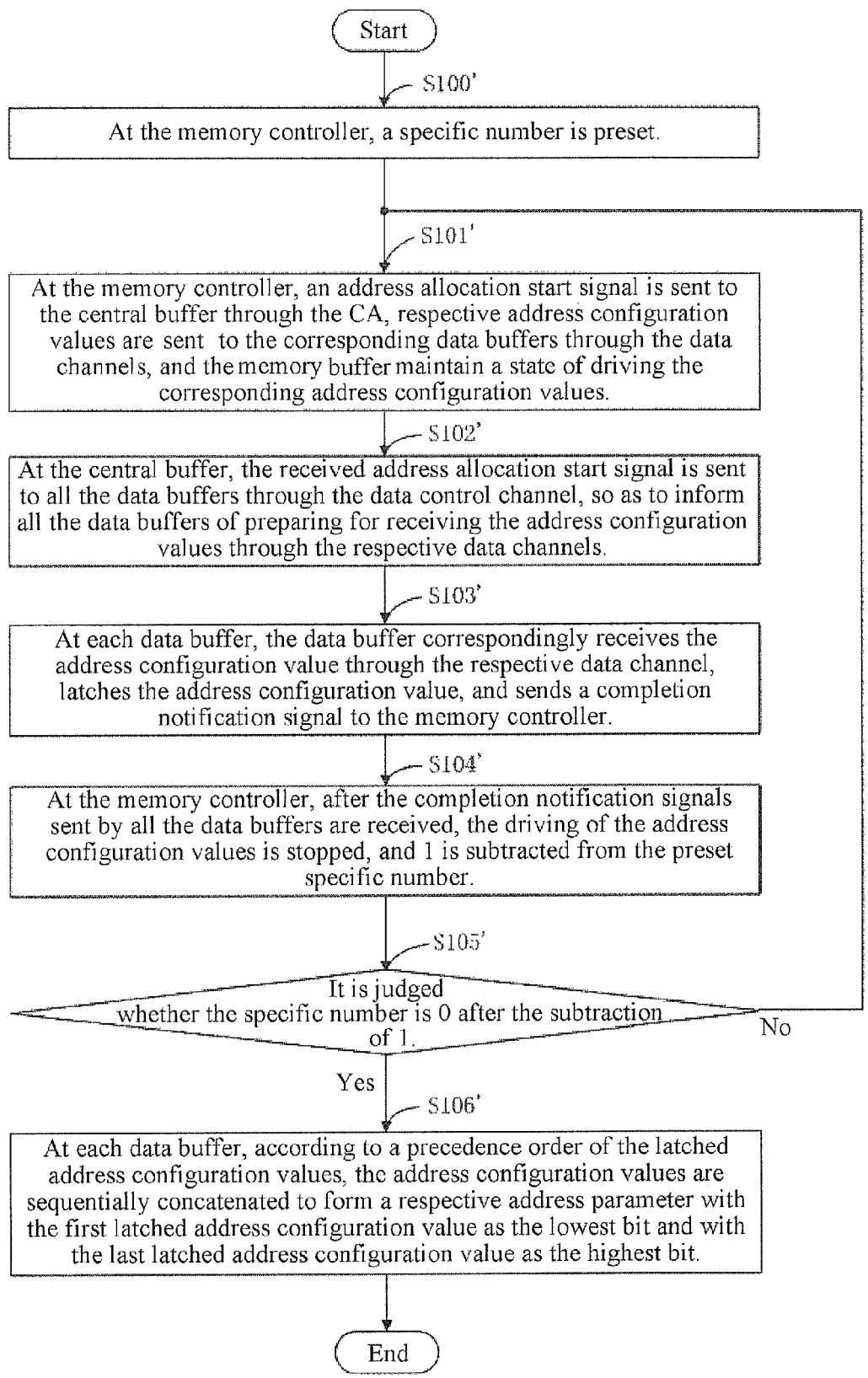
FIG. 4 is a schematic operational flow chart of a method for allocating addresses to data buffers in a distributed buffer chipset according to the second embodiment of the present invention.

FIG. 4 is a schematic operational flow chart of a method for allocating addresses to data buffers in a distributed buffer chipset according to the second embodiment of the present invention. Referring to FIG. 4, steps same as or similar to the steps of the method for allocating addresses to data buffers in a distributed buffer chipset in the above embodiment (as shown in FIG. 3) are indicated by the same or similar symbols, and the detailed description is omitted, so that the description of the present invention is more clear and understandable.

The major difference between the method for allocating addresses to data buffers in a distributed buffer chipset in the second embodiment and that in the first embodiment lies in that, in the method for allocating addresses to data buffers in a distributed buffer chipset in the first embodiment, each state of sending the address configuration value is maintained for designated time at the memory controller, so as to ensure that the data buffer has enough time to receive and latch the address configuration value thereof after receiving the address allocation start signal (steps S100, S101 and S104 as shown in FIG. 3); while the method for allocating addresses to data buffers in a distributed buffer chipset in the second embodiment does not adopt the manner of setting designated time, but adopts the manner of sending a notification signal by the data buffer to inform the memory of stopping the sending of a previous address configuration value and starting the sequence of sending a new address configuration value. Specifically, as show in FIG. 4, in Step S100', at the memory controller, only a specific number is preset, but designated time is not preset. Then in Step S101', an address allocation start signal is sent to the central buffer through the CA, respective address configuration values are sent to the corresponding data buffers through the data channels, and the memory buffer maintain a state of driving the corresponding address configuration values. Afterwards, in Step S102', the operation same as Step S102 in the first embodiment is performed to inform all the data buffers of receiving the address configuration values through the respective data channels. Then, in Step S103', after correspondingly receiving and latching the address configuration value, each data buffer sends a completion notification signal to the memory controller. In Step S104', at the memory controller, after the completion notification signals sent by all the data buffers are received, the driving of the address configuration values is stopped, 1 is subtracted from the preset specific number, and then a process same as that in the first embodiment (Step S105 and Step S106 as shown in FIG. 3) is adopted to further judge whether the specific number is 0 after the subtraction of 1, and if yes, according to a precedence order of the latched address configuration values, the address configuration values are sequentially concatenated to form a respective address parameter with the first latched address configuration value as the lowest bit and with the last latched address configuration value as the highest bit; otherwise, the above steps are repeated to allocate the next address configuration value.

The Third Embodiment

Figure 5:
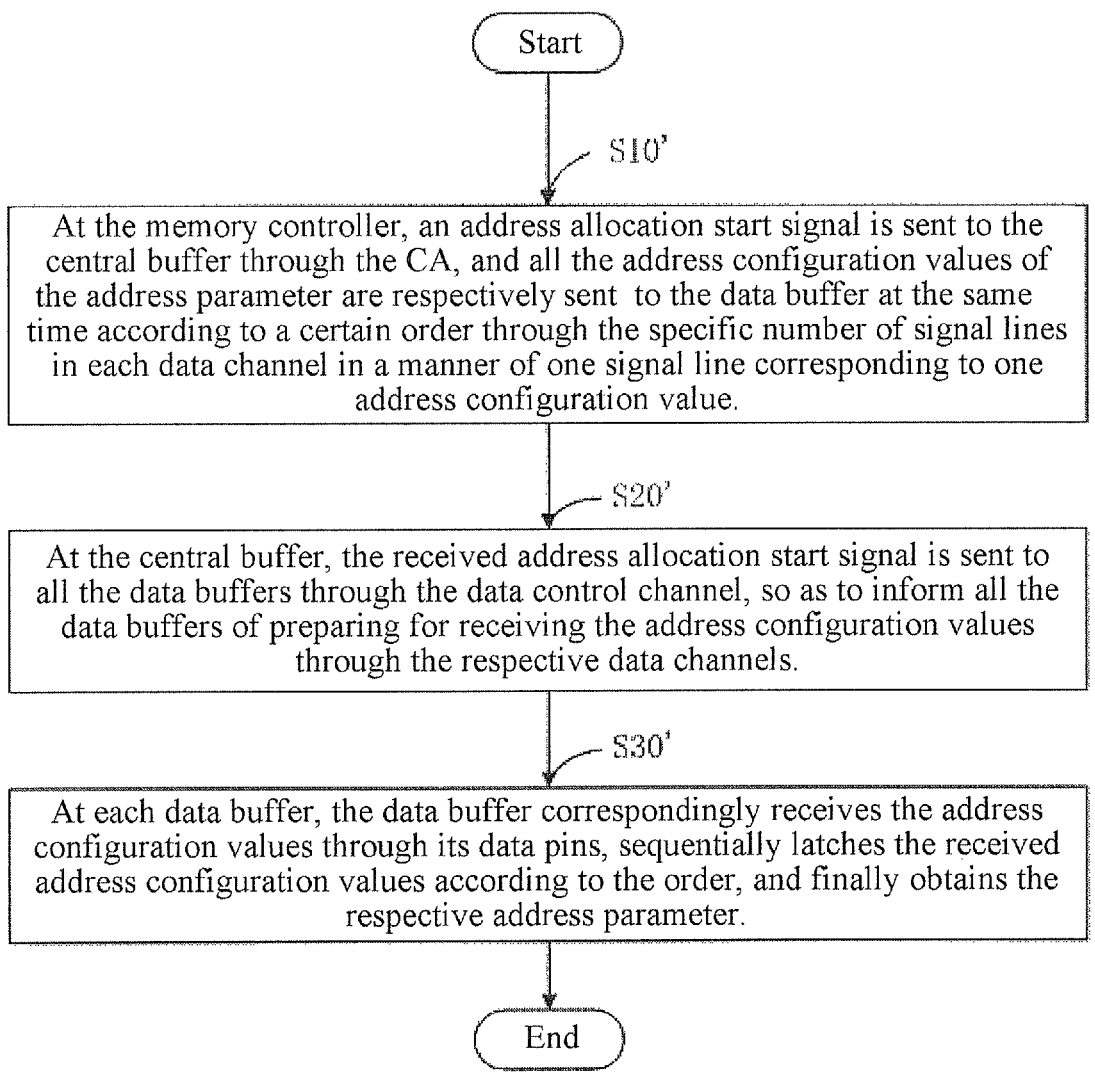
FIG. 5 is a schematic operational flow chart of a method for allocating addresses to data buffers in a distributed buffer chipset according to the third embodiment of the present invention.

FIG. 5 is a schematic operational flow chart of a method for allocating addresses to data buffers in a distributed buffer chipset according to the third embodiment of the present invention. Referring to FIG. 5, steps same as or similar to the steps of the method for allocating addresses to data buffers in a distributed buffer chipset in the above embodiments (as shown in FIG. 3 and FIG. 4) are indicated by the same or similar symbols, and the detailed description is omitted, so that the description of the present invention is more clear and understandable.

The major difference between the method for allocating addresses to data buffers in a distributed buffer chipset in the third embodiment and that in the first embodiment as well as that in the second embodiment lies in that, in the method for allocating addresses to data buffers in a distributed buffer chipset in the first and the second embodiment, the specific number is used as a cycle index for address allocation, and only one address configuration value is allocated for all the data buffers each time; while in the method for allocating addresses to data buffers in a distributed buffer chipset in the third embodiment, all the address configuration values of the address parameters are sent to the data buffers at a time, the operation of cyclic sending is not performed, and each signal line in the data channel correspondingly sends one address configuration value. Specifically, as shown in FIG. 5, in Step S10', at the memory controller, an address allocation start signal is sent to the central buffer through the CA, and all the address configuration values of the address parameter are respectively sent to the data buffer at the same time according to a certain order through the specific number of signal lines in each data channel in a manner of one signal line corresponding to one address configuration value. Then, Step S20' is performed, in which at the central buffer, the received address allocation start signal is sent to all the data buffers through the data control channel, so as to inform all the data buffers of preparing for receiving the address configuration values through the respective data channels. Finally, Step S30' is performed, in which at each data buffer, the data buffer correspondingly receives the address configuration values through its data pins, sequentially latches the received address configuration values according to the order, and finally obtains the respective address parameter.

In summary, the present invention adopts the following solutions: the memory controller informs in advance the central buffer of the beginning of the address allocation through the CA, and then the central buffer informs through the shared data control channel all the data buffers of preparing for receiving the address parameters through the respective data channels, and in this way, each data buffer receives the respective address parameter from the memory controller through the respective data channel and latches the address parameter. Thereby, the address allocation for all the data buffers is achieved while avoiding the configuration of address pins, thus facilitating the reduction of the size of the data buffer and the size of the entire distributed buffer chipset.

The description of the above embodiments is only to illustrate the principle and effect of the present invention, but is not intended to limit the present invention. Therefore, the protection scope of the present invention is subject to the protection scope of the appended claims.

What is claimed is:

1. A method for allocating addresses to data buffers without preconfigured address pins in a distributed buffer chipset, applied in a distributed buffer chipset controlled by a memory controller, wherein the distributed buffer chipset at least comprises:
    a central buffer connected to the memory controller through one Command/Address channel (CA); and
    a plurality of data buffers without preconfigured address pins, wherein each of the plurality of data buffers is respectively connected to the memory controller through a different respective data channel of a plurality of data channels, wherein the data buffers are connected to the central buffer through sharing one data control channel, the method for allocating addresses to data buffers in a distributed buffer chipset comprising:
    1) at the memory controller, (i) sending an address allocation start signal to the central buffer through the CA, and (ii) sending a different respective address parameter to each of the plurality of data buffers without preconfigured address pins through each of the plurality of respective data channels;
    1-1) at the memory controller, presetting designated time and a specific number; and
    1-2) at the memory controller, sending an address allocation start signal to the central buffer through the CA, resetting and starting the time, sending respective address configuration values to the corresponding data buffers through the data channels, and maintaining a state of driving the corresponding address configuration values before the time reaches the preset designated time;
    2) at the central buffer, sending the received address allocation start signal to all the data buffers through the data control channel, so as to inform all the data buffers of preparing for receiving the respective address parameters through the respective data channels; and
    3) at each data buffer, correspondingly receiving and latching its different respective address parameter through its different respective data channel;
    3-1) at each data buffer, correspondingly receiving its address configuration value through the respective data channel and latching its address configuration value by each data buffer;
    3-2) at the memory controller, when the time reaches the preset designated time, stopping sending the address configuration values, subtracting 1 from the preset specific number, and judging whether the specific number is 0 after the subtraction of 1, if yes, performing step 3-3); otherwise, returning to the step 1-2); and 3-3) at each data buffer, according to a precedence order of its latched address configuration values, sequentially concatenating its address configuration values to form a respective address parameter with the first latched address configuration value as the lowest bit and with the last latched address configuration value as the highest bit, and ending the allocation process.

2. The method for allocating addresses to data buffers in a distributed buffer chipset as in claim 1, wherein each address parameter is formed by a specific number of address configuration values, and each address configuration value is a binary number.

3. The method for allocating addresses to data buffers in a distributed buffer chipset as in claim 2, wherein a calculation formula of the specific number is as follows: the value of N is a minimum integer value satisfying an inequality $2N \geq M$, where N is the specific number, and M is the number of the data buffers in the distributed buffer chipset.

4. The method for allocating addresses to data buffers in a distributed buffer chipset as in claim 3, wherein the step 1) further comprises:
 1-a) at the memory controller, presetting a specific number, and
 1-b) at the memory controller, sending an address allocation start signal to the central buffer through the CA, sending respective address configuration values to each data buffers through the respective data channels, and maintaining a state of driving the corresponding address configuration values.

5. The method for allocating addresses to data buffers in a distributed buffer chipset as in claim 4, wherein the step 3) further comprises:
 3-a) at each data buffer, correspondingly receiving its address configuration value through the respective data channel, latching its address configuration value, and sending a completion notification signal to the memory controller by the data buffer,
 3-b) at the memory controller, after receiving the completion notification signals sent from all the data buffers, stopping sending the address configuration values, subtracting 1 from the preset specific number, and judging whether the specific number is 0 after the subtraction of 1, if yes, performing step 3-c); otherwise, returning to the step 1-b); and
 3-c) at each data buffer, according to a precedence order of its latched address configuration values, sequentially concatenating its address configuration values to form a respective address parameter with the first latched address configuration value as the lowest bit and with the last latched address configuration value as the highest bit, and ending the allocation process.

6. The method for allocating addresses to data buffers in a distributed buffer chipset as in claim 5, wherein each data channel has multiple signal lines respectively connected to a corresponding number of data pins of the corresponding data buffer.

7. The method for allocating addresses to data buffers in a distributed buffer chipset as in claim 6, wherein the step 1-a) further comprises: sending its address configuration value through any one of all the signal lines of each data channel.

8. The method for allocating addresses to data buffers in a distributed buffer chipset as in claim 7, wherein the step 3-a) further comprises: at each data buffer, once a certain data pin of each data buffer receives its address configuration value, latching its address configuration value.

9. The method for allocating addresses to data buffers in a distributed buffer chipset as in claim 6, wherein the step 1-a) further comprises: designating a certain data pin of each data buffer to receive its address configuration value, and sending the same address configuration value through all the signal lines of the same data channel, so as to ensure that the designated data pin of each data buffer receives its address configuration value.

10. The method for allocating addresses to data buffers in a distributed buffer chipset as in claim 3, wherein each data channel has multiple signal lines respectively connected to a corresponding number of data pins of the corresponding data buffer.

11. The method for allocating addresses to data buffers in a distributed buffer chipset as in claim 10, wherein the step 1) further comprises: at the memory controller, sending all the address configuration values of each address parameter to each corresponding buffer at the same time according to a certain order through the specific number of signal lines in each data channel in a manner of one signal line corresponding to one address configuration value.

12. The method for allocating addresses to data buffers in a distributed buffer chipset as in claim 11, wherein the step 3) further comprises: at each data buffer, correspondingly receiving its address configuration values through its data pins, sequentially latching its received address configuration values according to the order, and finally obtaining its respective address parameter by the data buffer.

13. The method for allocating addresses to data buffers in a distributed buffer chipset as in claim 1, wherein the designated time is set to ensure that each data buffer has enough time to receive and latch its address configuration value after receiving the address allocation start signal.

14. The method for allocating addresses to data buffers in a distributed buffer chipset as in claim 1, wherein each data channel has multiple signal lines respectively connected to a corresponding number of data pins of the corresponding data buffer.

15. The method for allocating addresses to data buffers in a distributed buffer chipset as in claim 14, wherein the step 1-1) further comprises: sending its address configuration value through anyone of all the signal lines of each data channel.

16. The method for allocating addresses to data buffers in a distributed buffer chipset as in claim 15, wherein the step 3-1) further comprises: at each data buffer, once a certain data pin of each data buffer receives its address configuration value, latching its address configuration value.

17. The method for allocating addresses to data buffers in a distributed buffer chipset as in claim 14, wherein the step 1-1) further comprises: designating a certain data pin of each data buffer to receive its address configuration value, and sending the same address configuration value through all the signal lines of the same data channel, so as to ensure that the designated data pin of each data buffer receives its address configuration value.

18. A method for allocating addresses to data buffers in a distributed buffer chipset, applied in a distributed buffer chipset controlled by a memory controller, wherein allocating addresses to data buffers is different than addressing, wherein the distributed buffer chipset at least comprises:
 (i) a central buffer connected to the memory controller through one Command/Address channel (CA), and
 (ii) a plurality of data buffers, wherein each one of the plurality of data buffers is directly connected to the memory controller via a separate and different respective data channel of a plurality of data channels, wherein each one of the plurality of respective data channels correspond to one of the plurality of data buffers, and wherein the data buffers are connected to the central buffer through sharing one data control channel, the method for allocating addresses to data buffers in a distributed buffer chipset comprising:

1) at the memory controller, (i) sending an address allocation start signal to the central buffer through the CA, and (ii) after sending the address allocation start signal, sending to each of the plurality of data buffers a different respective address parameter via the separate and different respective data channels corresponding to the data buffers, wherein the different respective address parameter is a separate address that is usable by the central data buffer for identifying one data buffer of the plurality of data buffers;

1-1) at the memory controller, presetting designated time and a specific number, and 1-2) at the memory controller, sending an address allocation start signal to the central buffer through the CA, resetting and starting the time, sending respective address configuration values to the corresponding data buffers through the data channels, and maintaining a state of driving the corresponding address configuration values before the time reaches the preset designated time;

2) at the central buffer, sending the received address allocation start signal to all the data buffers through the data control channel, so as to inform all the data buffers of preparing for receiving different respective address parameters through the plurality of respective data channels; and 3) at each data buffer, correspondingly receiving and latching its different respective address parameter through its different respective data channel;

3-1) at each data buffer, correspondingly receiving its address configuration value through the respective data channel and latching its address configuration value by each data buffer;

3-2) at the memory controller, when the time reaches the preset designated time, stopping sending the address configuration values, subtracting 1 from the preset specific number, and judging whether the specific number is 0 after the subtraction of 1, if yes, performing step 3-3); otherwise, returning to the step 1-2); and 3-3) at each data buffer, according to a precedence order of its latched address configuration values, sequentially concatenating its address configuration values to form a respective address parameter with the first latched address configuration value as the lowest bit and with the last latched address configuration value as the highest bit, and ending the allocation process.

\* \* \* \* \*